(12) United States Patent
Kobayashi

(10) Patent No.: US 7,154,373 B2
(45) Date of Patent: Dec. 26, 2006

(54) SURFACE MOUNTING CHIP NETWORK COMPONENT

(75) Inventor: Eiji Kobayashi, Nagano (JP)

(73) Assignee: Minowa KOA Inc. (JP)

( * ) Notice: Subject to any disclaimer, the term of this patent is extended or adjusted under 35 U.S.C. 154(b) by 0 days.

(21) Appl. No.: 10/506,947

(22) PCT Filed: Mar. 25, 2002

(86) PCT No.: PCT/JP02/02819

§ 371 (c)(1),
(2), (4) Date: Jun. 3, 2005

(87) PCT Pub. No.: WO03/081611

PCT Pub. Date: Oct. 2, 2003

(65) Prior Publication Data

US 2005/0253681 A1    Nov. 17, 2005

(51) Int. Cl.
*H01C 1/01* (2006.01)
(52) U.S. Cl. .................. 338/320; 338/307; 338/325
(58) Field of Classification Search ........... 338/221, 338/239, 260, 307, 320, 322, 325
See application file for complete search history.

(56) References Cited

U.S. PATENT DOCUMENTS

| | | | | |
|---|---|---|---|---|
| 3,745,508 | A * | 7/1973 | Bruder et al. ............. | 338/320 |
| 5,142,268 | A * | 8/1992 | Clark et al. ............... | 338/64 |
| 5,285,184 | A * | 2/1994 | Hatta et al. ............... | 338/313 |
| 5,734,313 | A * | 3/1998 | Doi et al. .................. | 338/260 |
| 6,005,474 | A * | 12/1999 | Takeuchi et al. ........... | 338/320 |
| 6,326,677 | B1 * | 12/2001 | Bloom et al. ............... | 257/638 |
| 6,577,225 | B1 * | 6/2003 | Poole ......................... | 338/320 |

FOREIGN PATENT DOCUMENTS

| | | |
|---|---|---|
| JP | 60-172302 | 11/1985 |
| JP | 61-203506 | 12/1986 |
| JP | 1-276602 | 11/1989 |
| JP | 2-288205 | 11/1990 |
| JP | 04-165603 | 6/1992 |
| JP | 7-320915 | 12/1995 |
| JP | 11-186008 A | 7/1999 |
| JP | 2002-100502 | 4/2002 |

OTHER PUBLICATIONS

English machine translation to Koi 11-186008 (Jul. 1999).*
International Search Report for PCT/JP02/02819; ISA/JP; Mailed: Jun. 25, 2002.

* cited by examiner

*Primary Examiner*—Tu Hoang
(74) *Attorney, Agent, or Firm*—Harness, Dickey & Pierce, P.L.C.

(57) ABSTRACT

A surface mounting chip network component in which a network having three or more odd number of terminals are formed on the surface of an insulating substrate and Tomb Stone Phenomenon is suppressed. Even number of network circuits are formed on the surface of the insulating substrate (2) and the same number of terminals (1) are arranged, respectively, on the opposite sides of the insulating substrate (2). Alternatively, even number of network circuits are formed on the surface of the insulating substrate (2) and the terminals (1) are arranged on the side edges of the insulating substrate (2) point-symmetrically with respect to the center of the surface of the insulating substrate (2).

4 Claims, 3 Drawing Sheets

Figure of circuit

Top surface

Bottom surface

SURFACE MOUNTING CHIP NETWORK COMPONENT

FIELD OF THE INVENTION

This invention relates to a surface mounting chip network component.

BACKGROUND OF THE INVENTION

Unexamined Japanese patent application H04-165603 discloses a surface mounting chip network component having network circuits with nine (odd) terminals formed on the surface of insulating substrate, wherein respective four and five terminals are arranged on the opposite sides on the substrate (see FIG. 3).

To mount surface mounting components to printed circuit board, pieces of solder paste are placed on the board to bridge each terminal of the components with the corresponding land on the board, followed by raising temperature to melt the pieces of solder paste and gradually cooling down to room temperature. The sequence of soldering is referred to as Reflow Soldering Process that bonds and connects each terminal with each land mechanically and electrically.

In the Reflow Soldering Process mentioned above, molten solder has good wetting condition on the surface of both said terminals and lands as well as low viscosity. Surface tension on the molten solder serves to attract each terminal to each land. In Reflow Soldering of surface mounting chip network component having network circuits with odd number of terminals formed on the surface of insulating substrate, surface tension at the side with more terminals may beat the tension at the opposite side with less terminals to break attracting force of solder at the opposite side so as to stand up the component. It is referred to as "Tomb Stone Phenomenon".

The purpose of the invention is to suppress Tomb Stone Phenomenon on surface mounting chip network component having network circuits with three or more odd number of terminals on insulating substrate.

DETAILED DESCRIPTION OF THE INVENTION

To solve the above problem, the first embodiment of surface mounting chip network component according to the present invention, having network circuits with three or more odd number of terminals 1 formed on the surface of insulating substrate 2, comprises an even number of network circuits to be formed on the surface of the insulating substrate 2, and an equal number of said terminals 1 to be arranged each of the facing sides on said insulating substrate 2.

For example in a surface mounting chip network component shown in FIG. 1, two network circuits are formed on both faces of insulating substrate 2 and the number of terminals formed on each network circuit is five. The rectangular substrate 2 has two pairs of facing sides, each of shorter facing sides having no terminals and each of longer facing sides having five terminals.

In another example of surface mounting chip network component shown in FIG. 2, two network circuits are formed on both faces of insulating substrate 2 and the number of terminals formed on each network circuit is five. The rectangular substrate 2 has two pairs of facing sides, each of shorter facing sides having a terminal and each of longer facing sides having four terminals.

Signs (A, B, C and D) shown on each corner of both sides of insulating substrate 2 are common to FIGS. 1, 2 and 3.

The surface mounting chip network components described above ensure balanced tension between terminals and lands on both sides of the substrate so as to suppress Tomb Stone Phenomenon.

The second embodiment of surface mounting chip network component according to the present invention, having network circuits with three or more odd number of terminals 1 formed on the surface of insulating substrate 2, comprises an even number of network circuits to be formed on the surface of insulating substrate 2, and said terminals to be arranged on each of the sides point-symmetrically with respect to the center of the surface of the substrate.

In each of the surface mounting chip network components shown in FIGS. 1 and 2, two network circuits are formed on both faces of insulating substrate 2 and the number of terminals formed on each network circuit is five. On the rectangular substrate 2 where two diagonals cross each other in the center of the surface, terminals 1 are arranged on each side of the substrate 2 point-symmetrically with respect to the intersection in the center.

On the component of the second embodiment, surface tension between terminals and lands uniformly disperses over the general substrate 2 so as to suppress Tomb Stone Phenomenon.

Network circuits to be used for the components of the first and second embodiments include resistor network with nine terminals containing a common terminal as shown in FIG. 3, attenuator circuit, and/or filter circuit with an odd number of terminals 1 containing capacitors and/or inductors, as well as voltage divider circuit with five terminals 1 as shown in FIG. 1.

The third embodiment of surface mounting chip network component according to the present invention, having network circuits with three or more odd number of terminals 1 formed on the surface of insulating substrate 2, comprises the same construction as either of the first or the second embodiment described above, wherein all terminals of the network circuits are arranged to locate on either of a pair of facing sides on the insulating substrate 2, and major terminals of a network circuit are located on the opposite side to the side where neighboring circuit has major terminals.

An example of the third embodiment is shown in FIG. 1, wherein all terminals of the network circuits are arranged to locate on either of a pair of facing sides on insulating substrate 2, and major terminals of a network circuit are located on the opposite side to the side where neighboring circuit has major terminals. FIG. 1 shows that the left circuit on the surface has major terminals on the side AB, while the right circuit has major terminals on the side CD.

In the third embodiment, it is preferable to include one, two, four, eight or sixteen pairs of equivalent network circuit having terminals 1 arranged point-symmetrically with respect to the center on the surface of insulating substrate 2 (see FIGS. 1 and 2). Such arrangement of terminals allows mounting even turned 180 degrees along the surface of the substrate to reduce the burden of component inspection on assembling electronic equipment using a surface mounting chip network component of the invention.

The reason why the number of pairs of the circuit is limited to sixteen is that too long chip component including more circuits will reduce mechanical strength of component. Thus a pair of circuit as shown in FIGS. 1 and 2 or two pairs are more preferable.

The two, four, eight or sixteen pairs of equivalent network circuit described above essentially consist of pairs of equivalent circuit but a pair can be equivalent to or different from others.

In the first, second and third embodiments described above, it is preferable that the insulating substrate 2 has one or more network circuits with circuit elements on both faces. It improves utility of the insulating substrate 2. The comparison of FIGS. 1 and 2 with FIG. 3 reveals that the use of both faces of the substrate enables to form larger circuit elements.

The effective use of insulating substrate described above is the essential effect of the invention. Simply comparing FIG. 1 with FIG. 3, it is clear that the component of the invention (FIG. 1) has no vain area on the surface such that the conventional component in FIG. 3 has two vain portions on the corners A and B. Such vain portions are inevitable for chip electronic components with an odd number of terminals 1, on which equal number of terminals aren't arranged in parallel on the facing sides.

Lager circuit elements as described above improve stability in characteristics. For example smaller dimensions of resistor, especially three smaller dimensions, worsen resistance value or temperature coefficient of resistance (TCR). Resistor with larger dimensions stands for higher current and voltage. Further more, larger components are generally easy to manufacture such that larger tolerance in displacement between conductor 4 and resistor 3 is allowed in a resistor element.

A network component with an odd number of terminals not less than three essentially has complicated circuit layout. The component of the invention shown in FIG. 1 or 2 has the construction that elemental circuits (resistors) are arranged on both faces of insulating substrate 2 so as to control unexpected short circuit between elements.

BRIEF DESCRIPTION OF THE DRAWINGS

Each of FIGS. 1 and 2 shows the construction of a surface mounting chip network component of the invention.

1: Terminal
2: Insulating substrate
3: Resistor
4: Conductor

DESCRIPTION OF THE PREFERRED EMBODIMENTS

Figure 1:
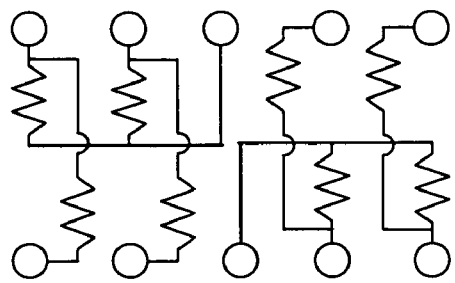
Figure 1:
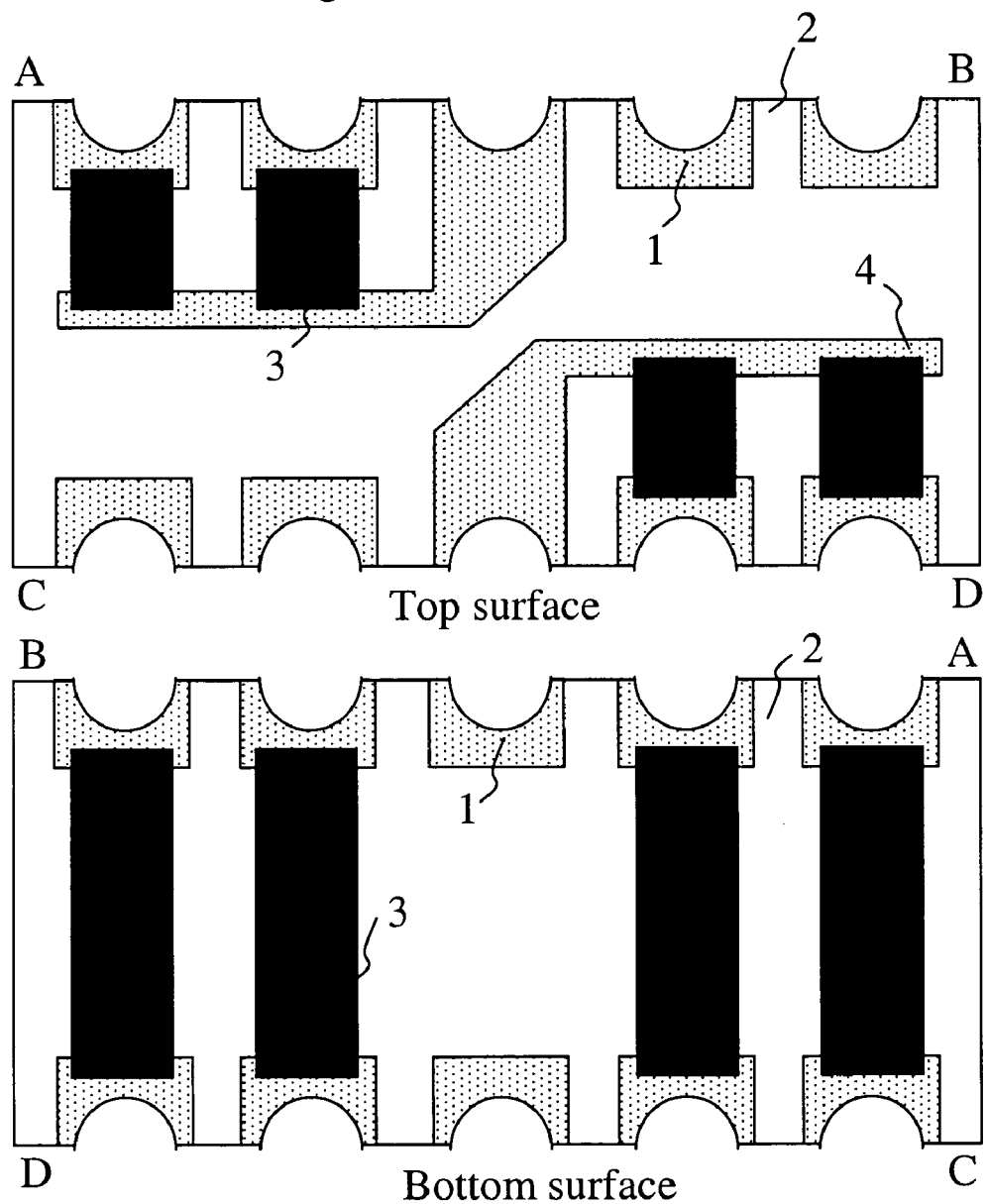

A surface mounting chip network component of FIG. 1 is described hereunder as a preferred embodiment of the invention. A sheet of large insulating substrate 2 made of alumina with crosswise slits on the surface, which is to be divided into strips of insulating substrate 2 shown in FIG. 1, is screen-printed with conductor paste of silver-based metal glaze, followed by firing to form terminals 1 and conductors 4. Through-hole printing, in which air is evacuated from the reverse side of the sheet of insulating substrate through through-holes to suck conductor paste on the opening of each holes inside so as to settle on the wall, is used for the above screen-printing. Electrodes are further formed in the same way on the reverse side of the insulating substrate at respective positions corresponding to the above terminals 1 on the surface. This procedure completes terminals on both faces of the insulating substrate connected through walls of respective through-holes.

Then resistor paste containing ruthenium oxide is screen-printed as shown in FIG. 1 after masking the body of each resistor element 3, followed by firing. Borosilicate glass paste is further screen-printed over the general body of each resistor element 3, followed by firing (not indicated in figure). Laser beam is irradiated to trim resistance so as to obtain aimed resistance value.

Overcoat paste of epoxy resin (not indicated in figure) is then screen-printed so as at least to cover resistor elements 3 and glass layers on both faces of the insulating substrate 2, followed by hardening.

After dividing the sheet into substrate strips, each strip is plated with nickel and then solder on the terminals 1 to obtain a surface mounting chip network component of the invention. The terminals 1 on the reverse side of the insulating substrate 2 are contacted to the surface of printed circuit board on mounting.

Figure 2:
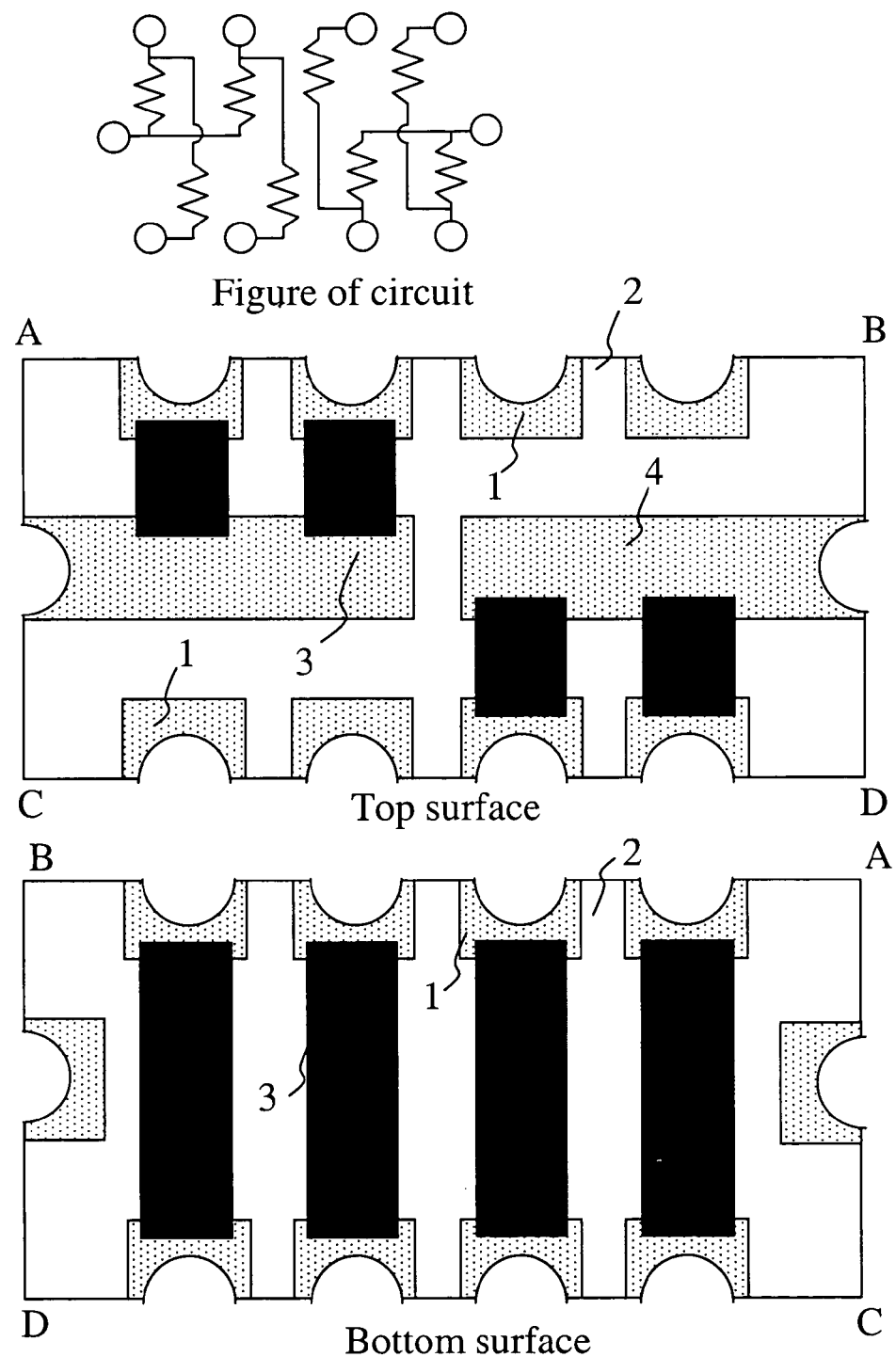
Figure 3:
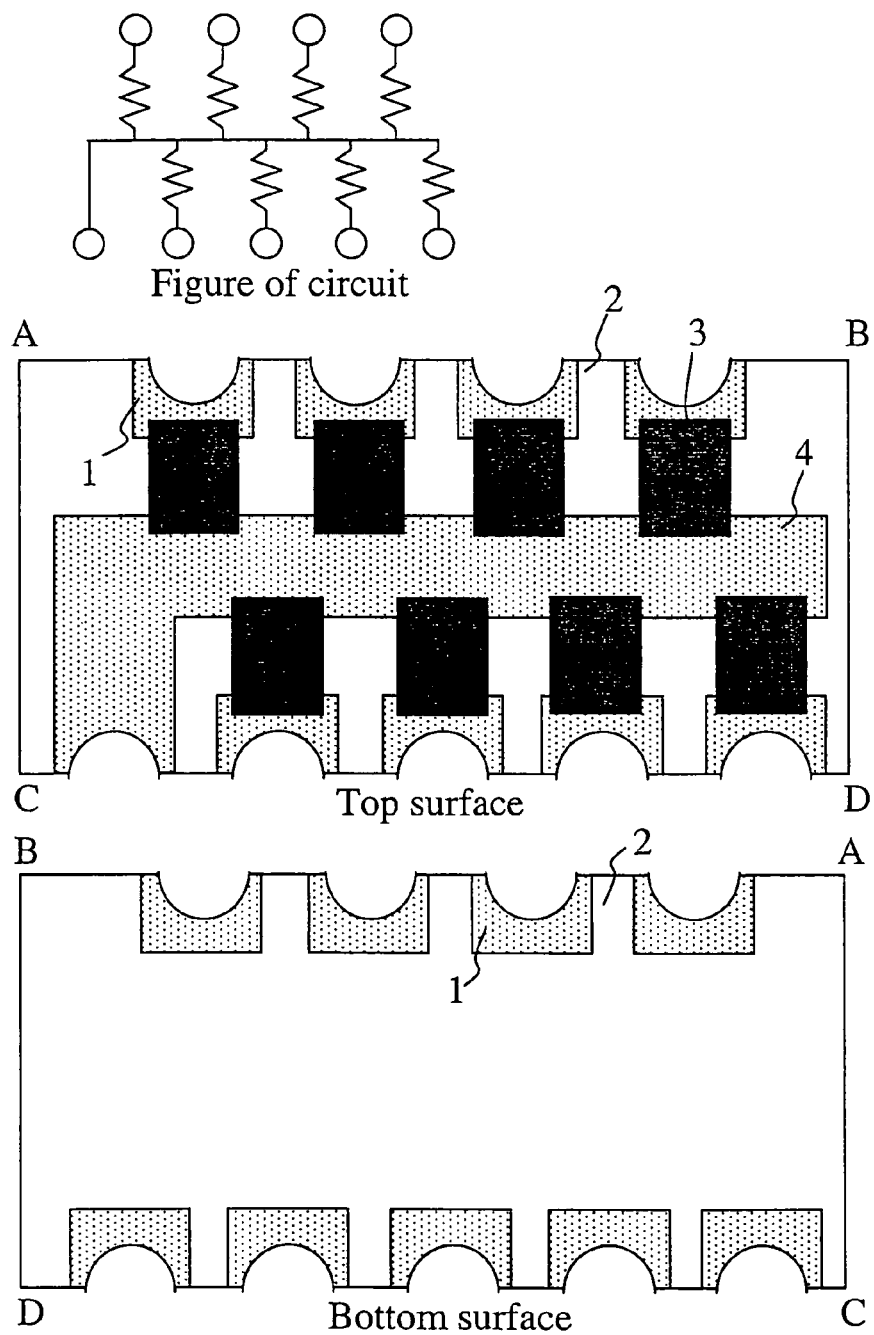
FIG. 3 shows the construction of a conventional surface mounting chip network component.

The manufacture of another surface mounting chip network component of the invention shown in FIG. 2 is made in the similar way to one for the component in FIG. 1, except the shape of insulating substrate (or the positions of through-holes) and the positions of openings on mask for screen-printing. Thus the component of FIG. 2 is obtained in accordance with the similar way to one for the component of FIG. 1.

Each of surface mounting chip network components shown in FIGS. 1 and 2 is a chip integrated with two equivalent and independent voltage divider circuits, which is allowed to mount to circuit board turned 180 degrees with respect to the center of the surface unless the surface is mistaken for the reverse side. To discriminate the surface and the reverse side, it is preferable to use said overcoat paste with different colors or to mark letters or signs for both faces. Coloring is more preferable to marking, since the former is free from marking process so as to facilitate production.

The component shown in FIG. 2 may have shortened length of longer sides compared with one in FIG. 1. The former will be more suitable for high-density packaging in some concept of circuit designing.

Thin film technologies such as spattering, vapor deposition and CVD are also available to form conductor films (terminal 1, conductor 4), resistor films 3 and glass coat films, instead of screen printing which is one of thick film technologies with high production efficiency. Different components of chip type and/or discrete type can be arranged partially or generally on the surface of said insulating substrate 2.

A conductive adhesive containing silver is a substitute for silver-based metal glaze used in the embodiments of the invention as conductive paste.

The material of said resistor element, ruthenium oxide being used in the above embodiments, is selected according to the type of resistor such as metal film resistor or carbon film resistor. Material of glass coat is not limited to lead borosilicate that is used in the above embodiments of the invention. Resin is substitutable for glass coat. A resin other than epoxy or a glass material can be selected for overcoat according to the purpose of component.

While laser is used for trimming in the above embodiments of the invention, sand blasting can be another choice.

It is able to change the production process described above for a surface mounting chip component of the invention. For example, resistor element 3 can be formed prior to forming conductor element 4. In the embodiments described above, the step to form edge electrodes on sides of said insulating substrate 2 isn't included in the process of forming terminals 1, since through-hole printing is applied. However the step to form edge electrodes is added to said plating process as required, after dividing said sheet into substrate pieces to expose edges.

While the construction of individual network circuit having five terminals 1, three on a side of insulating substrate 2 and two on the opposite side, another construction such that four terminals 1 are prepared on a side and a single terminal 1 is prepared on the opposite side is also available to obtain the effect of the invention if they are satisfied with the conditions described in the above embodiments. The arrangement of an odd number of terminals 1 on the insulating substrate 2 isn't thus limited to the examples shown above. Further it is able to select three, seven or nine terminals 1 for individual network circuit, instead of five terminals.

For the shape of insulating substrate 2 for the invention, any of square, triangle, hexagon, octagon and circle is available instead of rectangle.

While voltage divider circuit is described as the network circuit having three or more terminals in the above embodiments, attenuator circuit or another network circuit such as CR network circuit including resistors and capacitors together is substitutable.

INDUSTRIAL APPLICABILITY

A surface mounting chip network component according to the present invention, having network circuits with three or more odd number of terminals 1 formed on the surface of insulating substrate 2, suppresses Tomb Stone Phenomenon.

What is claimed is:

1. A surface mounting chip network component having an even number of network circuits formed on the surface of a rectangular insulating substrate, each of the network circuits having three or more odd number of terminals and comprising an equal number of said terminals arranged at each of its facing sides on said insulating substrate, and elements of said network circuits formed on both faces of said insulating substrate;

wherein each individual of said network circuits has a common conductor extended from a terminal on a side of said insulating substrate, and (a) a resistor connected to said common conductor at one of its edges;

(b) another terminal on a side of said insulating substrate to which the other edge of said resistor is connected;

(c) another resistor formed on the reverse side with respect to the face of the insulating substrate where the resistor of (a) is formed, one edge of said another resistor connected to the terminal of (b); and (d) an independent terminal connected to the other edge of the resistor of (c), the independent terminal located on the opposite side with respect to the side of said insulating substrate where the terminal of (b) is arranged; and wherein all of said network circuits formed on said insulating substrate are equivalent and the terminals of at least two network circuits are arranged point-symmetrically with respect to a center of the surface of said insulating substrate.

2. A surface mounting chip network component according to claim 1, wherein said terminals are arranged on all of four sides of each of said network circuits with the number of terminals on a side being equal to one on the opposite side and the number of terminals on one of the other remaining two opposite sides being equal to the other.

3. A surface mounting chip network component according to claim 1, wherein said insulating substrate has means to discriminate said both faces.

4. A surface mounting chip network component according to claim 3, wherein said means comprises at least one of:

different colors of overcoat for the network circuits on said both faces of said insulating substrate; and signs printed on the surface of the overcoat.

* * * * *